(12) United States Patent
Kim et al.

(10) Patent No.: US 8,115,246 B2
(45) Date of Patent: Feb. 14, 2012

(54) SEMICONDUCTOR DEVICE INCLUDING PROTRUSION TYPE ISOLATION LAYER

(75) Inventors: Dong-hyun Kim, Suwon-si (KR); Jai-kyun Park, Hwaseong-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 86 days.

(21) Appl. No.: 12/588,983

(22) Filed: Nov. 4, 2009

(65) Prior Publication Data
US 2010/0258860 A1    Oct. 14, 2010

(30) Foreign Application Priority Data

Apr. 10, 2009    (KR) .................. 10-2009-0031427

(51) Int. Cl.
*H01L 29/788*    (2006.01)

(52) U.S. Cl. ........ 257/316; 257/317; 257/319; 257/382; 257/906; 257/907; 257/E21.548; 257/E21.69; 257/E29.103

(58) Field of Classification Search .................. 257/316, 257/317, 319, E21.548, E21.69
See application file for complete search history.

(56) References Cited

U.S. PATENT DOCUMENTS

| | | | |
|---|---|---|---|
| 6,929,999 B2* | 8/2005 | Park et al. | 438/253 |
| 7,348,627 B2* | 3/2008 | Matsui et al. | 257/316 |
| 2004/0238849 A1* | 12/2004 | Miwa | 257/202 |

FOREIGN PATENT DOCUMENTS

| | | |
|---|---|---|
| KR | 10-2007-0002589 A | 1/2007 |
| KR | 10-2007-0002593 A | 1/2007 |
| KR | 10-2007-0017656 A | 2/2007 |

* cited by examiner

*Primary Examiner* — Zandra Smith
*Assistant Examiner* — Tsz Chiu
(74) *Attorney, Agent, or Firm* — Lee & Morse, P.C.

(57) ABSTRACT

A semiconductor device may include a semiconductor layer having a convex portion and a concave portion surrounding the convex portion. The semiconductor device may further include a protrusion type isolation layer filling the concave portion and extending upward so that an uppermost surface of the isolation layer is a at level higher that an uppermost surface of the convex portion.

19 Claims, 15 Drawing Sheets

SEMICONDUCTOR DEVICE INCLUDING PROTRUSION TYPE ISOLATION LAYER

BACKGROUND

1. Field

Embodiments relate to a semiconductor device, and more particularly, to a semiconductor device including a protrusion type isolation layer.

2. Description of the Related Art

Due to design preferences, minute structures may be required to be formed in semiconductor devices. However, forming such minute structures may raise problems, e.g., decrease in the manufacturing yield and increase in the manufacturing costs of semiconductor devices. For example, when the size of an isolation layer in a cell region is reduced, it may not be easy to distinguish areas between nodes, the isolation layer may have an insufficient gap-fill, or contact reliability may decrease due to a reduction of contact regions or misalignment of the contact regions.

SUMMARY

Embodiments are directed to a semiconductor device and a method of forming a semiconductor device including a protrusion type isolation layer, which substantially overcome one or more of the problems due to the limitations and disadvantages of the related art.

It is a feature of an embodiment to provide a semiconductor device where minute structures may be formed without a resulting decrease in the manufacturing yield and increase in the manufacturing costs.

At least one of the above and other features and advantages may be realized by providing a semiconductor device having a semiconductor layer including a convex portion and a concave portion surrounding the convex portion, a protrusion type isolation layer that may fill the concave portion and extend upward so that an uppermost surface of the isolation layer may be at a level higher than an uppermost surface of the convex portion, at least one trench that traverses the convex portion and may have a line shape, at least one gate structure in the at least one trench, and a contact plug on and electrically connected to a portion of the convex portion, and that may be surrounded by the isolation layer.

The at least one gate structure of the semiconductor device may have a gate insulating layer and a gate conductive layer that may be buried in the semiconductor layer. Moreover, an uppermost surface of the at least one gate structure may be at a level lower than the uppermost surface of the isolation layer. Furthermore, the uppermost surface of the at least one gate structure may be at a level lower than the uppermost surface of the convex portion. Moreover, the at least one gate structure may have a capping layer on the gate conductive layer that fills the trench, and an uppermost surface of the at least one gate structure may be at about the same level as the uppermost surface of the isolation layer.

An uppermost surface of the contact plug of the semiconductor device may be at about the same or a lower level than the uppermost surface of the isolation layer. Furthermore, a bit line may be on and electrically connected to the contact plug, where the bit line may be disposed below the uppermost surface of the isolation layer.

The isolation layer of the semiconductor device may include a plurality of openings in an array, where each opening may expose an active region of the semiconductor layer. Moreover, the isolation layer may include silicon nitride. Moreover, an insulating layer may be formed on a portion of the convex portion. Furthermore, the convex portions and the concave portions may be arranged on the semiconductor layer by using a first sacrificial layer pattern as an etching mask.

At least one of the above and other features and advantages may also be realized by providing a semiconductor device having a semiconductor layer that may include a convex portion and a concave portion surrounding the convex portion, and a protrusion type isolation layer that may fill the concave portion and may extend upward so that an uppermost surface of the isolation layer may be at a level higher that an uppermost surface of the convex portion.

At least one of the above and other features and advantages may be realized by providing a method of forming a semiconductor device that may include providing a semiconductor layer, forming a convex portion and a concave portion that may surround the convex portion in the semiconductor layer, forming a protrusion type isolation layer to that may fill the concave portion so that an uppermost surface of the isolation layer may be at a level higher than an uppermost surface of the convex portion, forming at least one trench traversing the convex portion and that may have a line shape, forming a gate structure in the at least one trench, forming a contact plug by filling a conductive material in a contact hole, and forming a bit line electrically connected to the contact plug that may cross a gate line. Where the contact plug may be on and electrically connected to a portion of the convex portion and may be surrounded by the isolation layer.

The method of forming the convex portions and the concave portions may include forming a first sacrificial layer above the semiconductor layer, patterning the first sacrificial layer to form a first sacrificial layer pattern to expose portions of the semiconductor layer, and removing the exposed portions of the semiconductor layer by using the first sacrificial layer pattern as an etching mask. Where forming the isolation layer may include forming a plurality of openings in an array, each opening may expose an active region of the semiconductor layer.

The method of forming the gate structure may include forming a gate insulating layer buried in the semiconductor layer, and forming a gate conductive layer buried in the semiconductor layer. Furthermore, the method of forming the gate structure may further include forming a capping layer on the gate conductive layer that may fill the trench so that an uppermost surface of the at least one gate structure may be at about the same level as the uppermost surface of the isolation layer.

BRIEF DESCRIPTION OF THE DRAWINGS

The above and other features and advantages will become more apparent to those of ordinary skill in the art by describing in detail exemplary embodiments with reference to the attached drawings, in which:

FIGS. 3A through 14A illustrate top views of stages in a method of manufacturing a semiconductor device including a protrusion type isolation layer according to an embodiment;

FIGS. 3B through 14B illustrate cross-sectional views respectively taken along lines A-A' and B-B' of FIGS. 3A through 14A;

DETAILED DESCRIPTION

Figure 1:
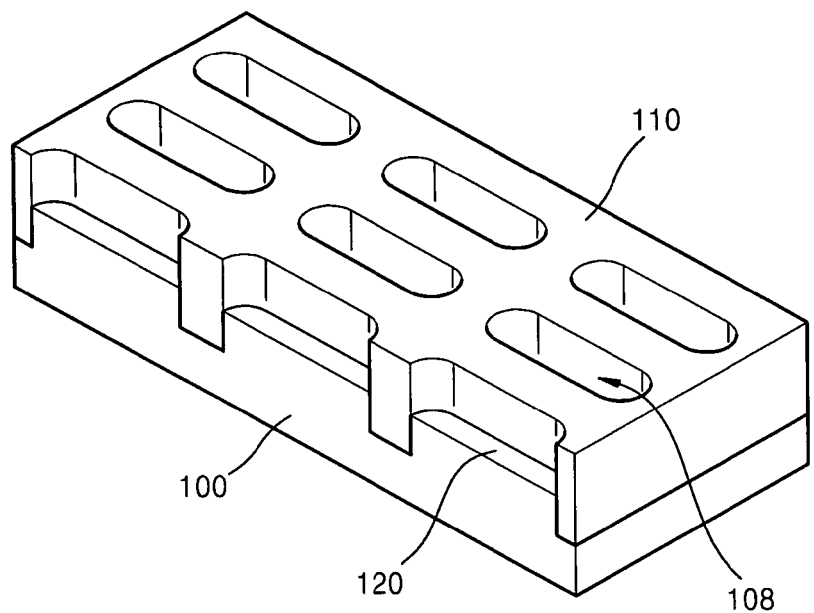
FIG. 1 illustrates a perspective view of an isolation layer according to an embodiment.

Korean Patent Application No. 10-2009-0031427, filed on Apr. 10, 2009, in the Korean Intellectual Property Office, and entitled: "Semiconductor Device Including Protrusion Type Isolation Layer," is incorporated by reference herein in its entirety.

It will be understood that when an element, such as a layer, a region, or a substrate, is referred to as being "on," "connected to" or "coupled to" another element, it may be directly on, connected or coupled to the other element or intervening elements may be present. In contrast, when an element is referred to as being "directly on," "directly connected to" or "directly coupled to" another element or layer, there are no intervening elements or layers present. Like reference numerals refer to like elements throughout. As used herein, the term "and/or" includes any and all combinations of one or more of the associated listed items.

It will also be understood that, although the terms first, second, third, etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of exemplary embodiments.

Spatially relative terms, such as "above," "upper," "beneath," "below," "lower," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, when the device in the figures is turned over, elements described as "below" or "beneath" other elements or features would then be oriented "above" the other elements or features. Thus, the exemplary term "above" may encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of exemplary embodiments. As used herein, the singular forms "a," "an" and "the" are intended to include the plural forms as well, unless the context clearly indicates otherwise. It will be further understood that the terms "comprises" and/or "comprising" when used in this specification, specify the presence of stated features, integers, steps, operations, elements, and/or components, but do not preclude the presence or addition of one or more other features, integers, steps, operations, elements, components, and/or groups thereof.

Embodiments described herein, with reference to the drawings, relate to exemplary embodiments and intermediate structures. As such, variations from the shapes of the illustrations as a result, for example, of manufacturing techniques and/or tolerances, are to be expected. Thus, exemplary embodiments should not be construed as limited to the particular shapes of regions illustrated herein but may be to include deviations in shapes that result, for example, from manufacturing. For example, an implanted region illustrated as a rectangle may, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes may be not intended to illustrate the actual shape of a region of a device and are not intended to limit the scope of exemplary embodiments.

Unless otherwise defined, all terms (including technical and scientific terms) used herein have the same meaning as commonly understood by one of ordinary skill in the art to which exemplary embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 16:
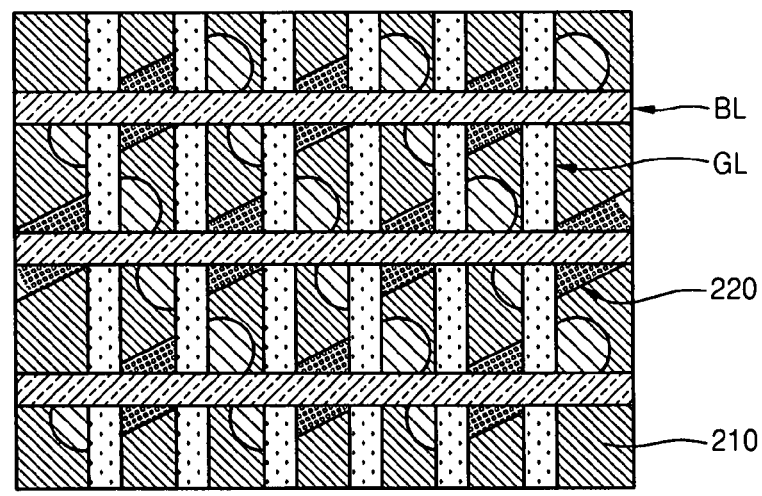
FIG. 16 illustrates a top view of a semiconductor device having an isolation layer according to an embodiment.

FIG. 1 illustrates a perspective view of an isolation layer 110, according to an exemplary embodiment. Referring to FIG. 1, the isolation layer 110 may be disposed on a portion of a semiconductor layer 100. The isolation layer 110 may be a protrusion type formed on the semiconductor layer 100 while extending from an uppermost surface of the semiconductor layer 100. The isolation layer 110 may include a plurality of openings 108 that are regularly arrayed to expose portions of the semiconductor layer 100. Each of the portions of the semiconductor layer 100 exposed by the plurality of openings 108 in the insulation layer 110 may be an active region 120. Referring to FIG. 1, although the plurality of openings 108 may be arrayed in parallel along first and second directions, the present embodiment may not limited thereto. Another exemplary array of the plurality of openings 108 is illustrated in FIG. 16.

Figure 2A:
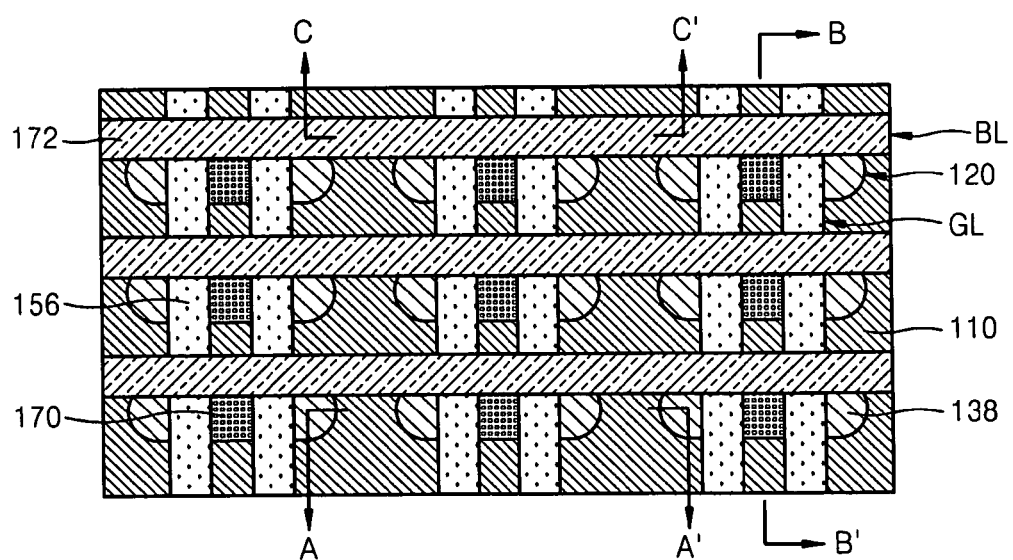
FIG. 2A illustrates a top view of a semiconductor device including a protrusion type isolation layer according to an embodiment.
Figure 2B:
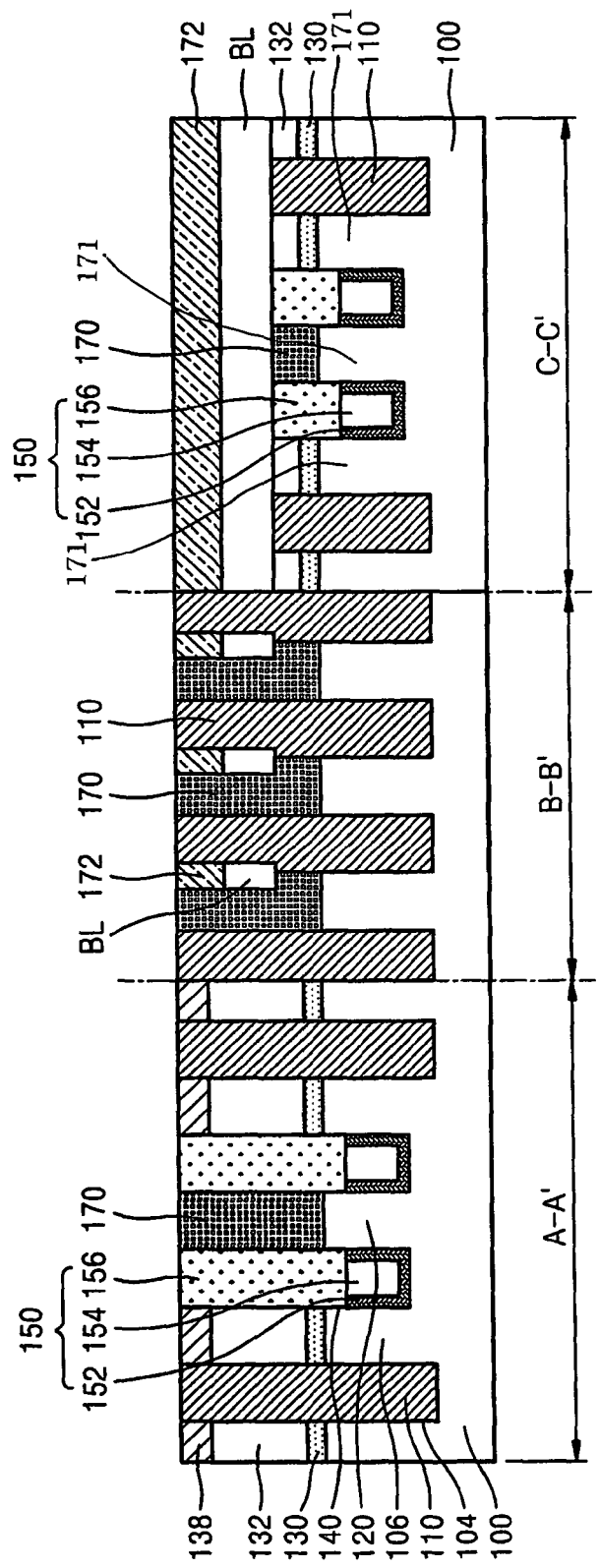
FIG. 2B illustrates a cross-sectional view of the semiconductor device of FIG. 2A, taken along lines A-A', B-B', and C-C'.

FIG. 2A illustrates a top view of a semiconductor device including a protrusion type isolation layer 110 according to an exemplary embodiment. FIG. 2B illustrates a cross-sectional view of the semiconductor device of FIG. 2A, taken along lines A-A', B-B', and C-C'.

Referring to FIGS. 2A and 2B, a semiconductor layer 100 may include a convex portion 106, and a concave portion 104 surrounding the convex portion 106. Also, the semiconductor layer 100 may include at least one trench 140 traversing the convex portion 106 and having a line shape.

As illustrated in FIG. 2B, the isolation layer 110 may fill the concave portion 104 in such a manner that an uppermost surface thereof is at a level higher than an uppermost surface of the convex portion 106. The isolation layer 110 may include silicon nitride, and may have a multi-layer formed by stacking a plurality of layers.

A gate structure 150 may be formed in the active region 120 of the semiconductor layer 100, and may traverse the convex portion 106. Because the isolation layer 110 may have a shape protruding from the semiconductor layer 100, as shown in FIG. 1, an uppermost surface of the isolation layer 110 may be at a level that is as high as, or higher than, that of the gate structure 150. Moreover, the gate structure 150 may be disposed in at least one of the trenches 140. Furthermore, the gate structure 150 may include a gate insulating layer 152 and a gate conductive layer 154. Also, the gate structure 150 may include a capping layer 156.

An uppermost surface of the gate structure 150, e.g., an uppermost surface of the gate conductive layer 154, may be at a level lower than the uppermost surface of the isolation layer 110. Also, the uppermost surface of the gate structure 150, e.g., an uppermost surface of the gate conductive layer 154, may be at a level lower than the uppermost surface of the convex portion 106 of the semiconductor layer 100. In addition, the gate insulating layer 152 and the gate conductive layer 154 of the gate structure 150 may be buried in the semiconductor layer 100.

Referring to FIG. 2B, a contact plug 170 may be disposed on and electrically connected to a portion of the convex portion 106, e.g., a source/drain region 171. Moreover, the contact plug 170 may be surrounded by the isolation layer 110. An uppermost surface of the contact plug 170 may be at the same level as, or a lower level than, the uppermost surface of the isolation layer 110. Also, a first interlayer insulating layer 130 may be disposed on portions of the convex portion 106 on which the contact plug 170 is not disposed.

The semiconductor device may further include a bit line BL that is electrically connected to the contact plug 170. The bit line BL may be disposed below the uppermost surface of the isolation layer 110. However, the position of the bit line BL is not limited thereto. For example, the bit line BL may be disposed above the uppermost surface of the isolation layer 110. As shown in FIG. 2B, a line capping layer 172 may be formed on the bit line BL.

FIGS. 3A through 14A illustrate top views of stages in an exemplary method of manufacturing a semiconductor device including a protrusion type isolation layer according to an exemplary embodiment. FIGS. 3B through 14B illustrate cross-sectional views respectively taken along lines A-A' and B-B' of FIGS. 3A through 14A, respectively. Moreover, FIGS. 5A through 14B may include the isolation layer 110 illustrated in FIG. 1.

Figure 3A:
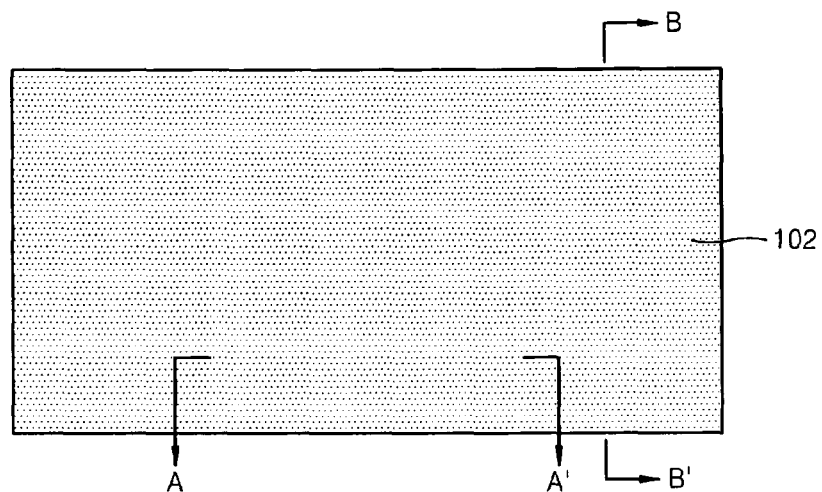
Figure 3B:
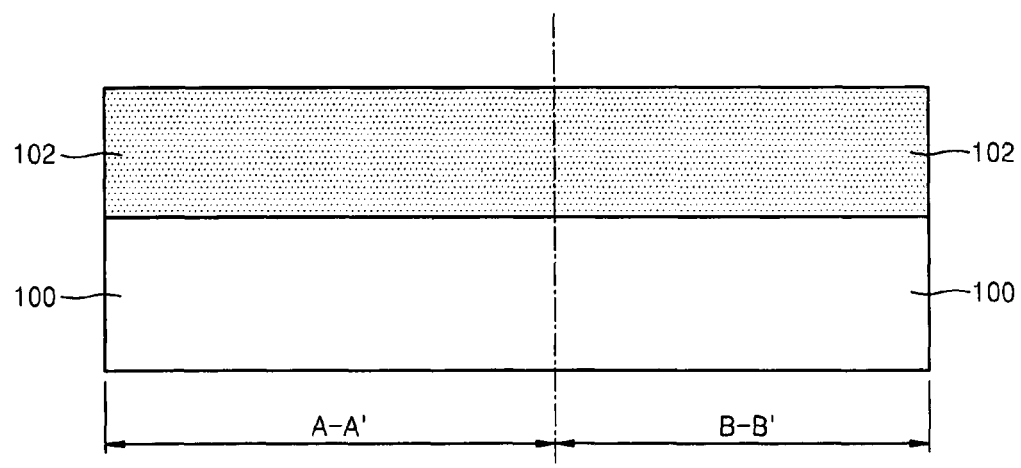

Referring to FIGS. 3A and 3B, a semiconductor layer 100 may be provided. The semiconductor layer 100 may include a substrate including semiconductor materials, e.g., silicon, or silicon-germanium, an epitaxial layer, a silicon-on-insulator (SOI) layer, a semiconductor-on-insulator (SEOI) layer, or the like.

A first sacrificial layer 102 may be formed above the semiconductor layer 100. The first sacrificial layer 102 may be formed using, e.g., thermal oxidation, rapid thermal oxidation (RTO), chemical vapor deposition (CVD), plasma enhanced CVD (PECVD), high density plasma CVD (HDP-CVD), sputtering, or the like. The first sacrificial layer 102 may include, e.g., oxide, nitride, or oxynitride. For example, the first sacrificial layer 102 may include silicon oxide, silicon nitride, or silicon oxynitride. The first sacrificial layer 102 may have an etching selectivity different from that of an isolation layer 110 (illustrated in FIG. 5B) to be formed in a subsequent process. Also, a pad layer (not shown) and/or a polysilicon layer (not shown) may be further formed between the semiconductor layer 100 and the first sacrificial layer 102. The pad layer and/or the polysilicon layer may allow the first sacrificial layer 102 to be easily formed and may protect the semiconductor layer 100 from an external environment, e.g., an etchant or the like, during a subsequent process.

Figure 4A:
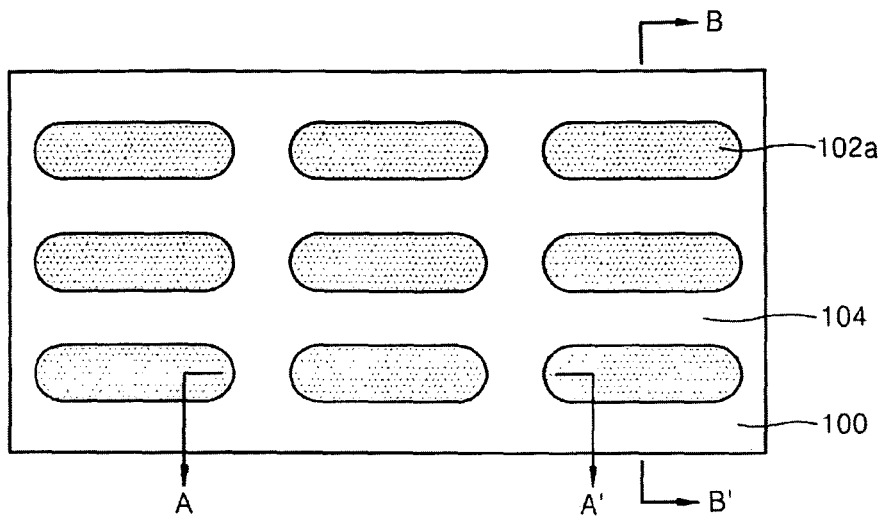
Figure 4B:
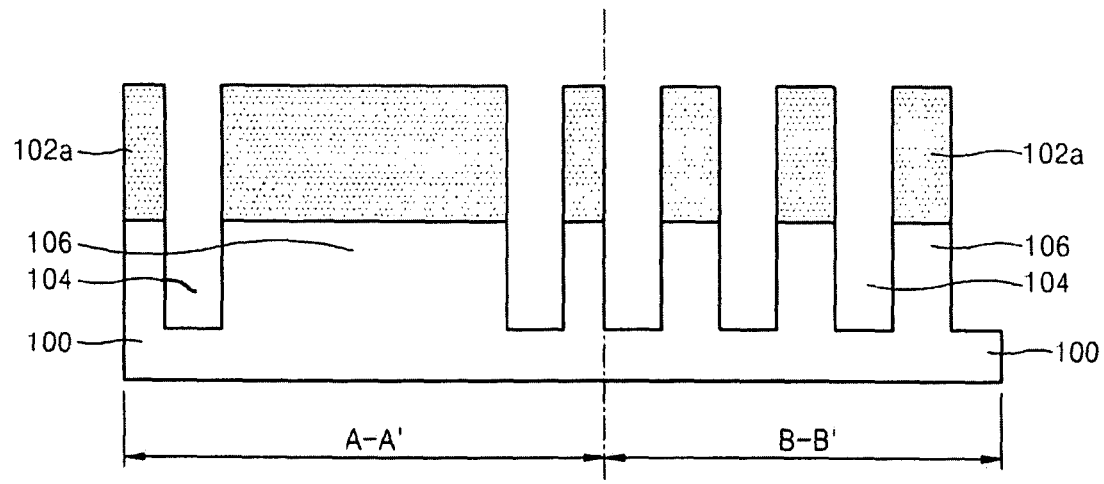

Referring to FIGS. 4A and 4B, the first sacrificial layer 102 may be patterned to form the first sacrificial layer patterns 102a that expose portions of the semiconductor layer 100. After that, the exposed portions of the semiconductor layer 100 may be partially removed by using the first sacrificial layer patterns 102a as an etching mask, so that a convex portion 106 and a concave portion 104 may be formed in the semiconductor layer 100. The concave portion 104 may surround the convex portion 106. The concave portion 104 may be formed by, e.g., performing an anisotropic etching such as a reactive ion etching (RIE), a plasma etching, or an incline etching.

The operation of patterning the first sacrificial layer 102 and the operation of partially removing the semiconductor layer 100 may be simultaneously performed. For example, a mask layer (not shown) used to pattern the first sacrificial layer 102 may also be used to remove the corresponding portions of the semiconductor layer 100. In this case, the mask layer may have a different etching selectivity with respect to the first sacrificial layer 102 and the semiconductor layer 100. In a subsequent process, the isolation layer 110 (illustrated in FIG. 5B) may be formed in the concave portion 104, and an active region 120 (illustrated in FIG. 6B) including a source/drain region and a channel region may be formed in the convex portion 106.

Figure 5A:
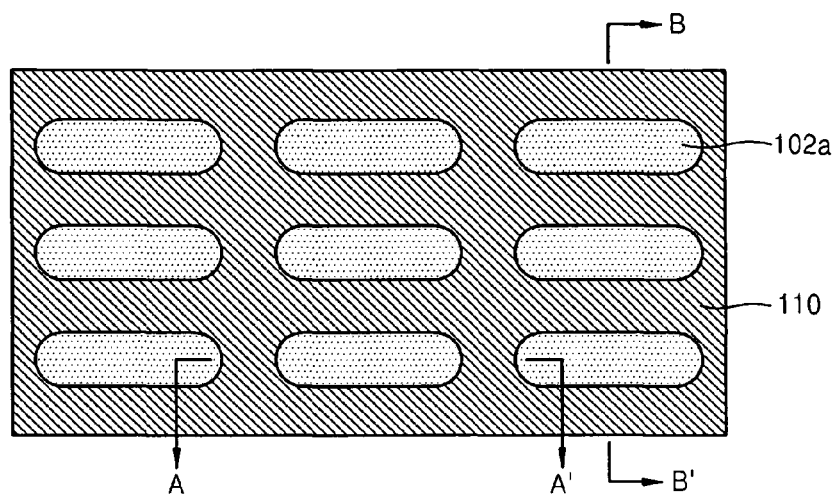
Figure 5B:
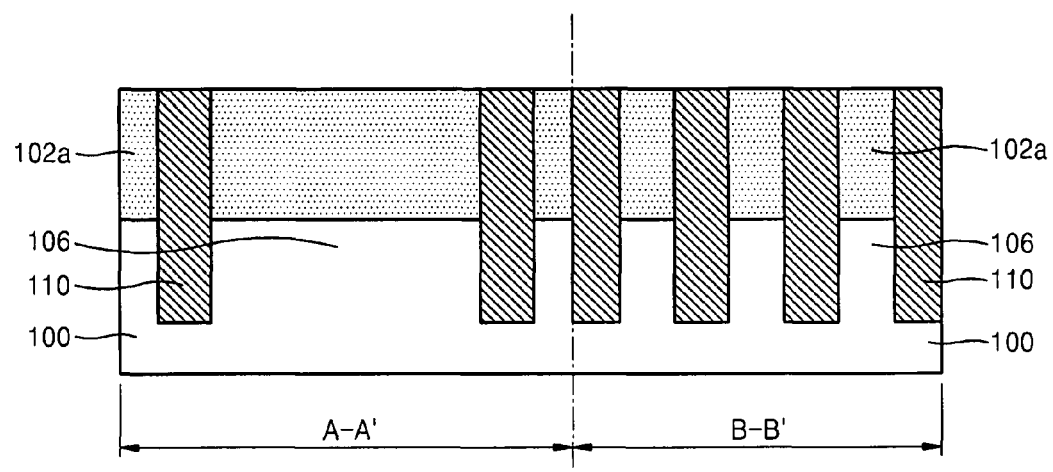

Referring to FIGS. 5A and 5B, the isolation layer 110 may be formed in the concave portion 104 to fill the concave portion 104. Also, the isolation layer 110 may extend to fill spaces between the first sacrificial layer patterns 102a. Accordingly, an uppermost surface of the isolation layer 110 may extend to a level higher than an uppermost surface of the convex portion 106 of the semiconductor layer 100.

An example of formation of the isolation layer 110 will now be described in detail. An insulating layer (not shown) may be formed to fill the concave portions 104 and the spaces between the first sacrificial layer patterns 102a and may cover the first sacrificial layer patterns 102a. After that, an etch-back or chemical mechanical polishing (CMP) may be performed so that uppermost surfaces of the insulating layer and the first sacrificial layer patterns 102a are at the same level, thereby forming the isolation layer 110.

In an implementation, a liner layer (not shown) for easily forming the isolation layer 110 and enhancing the quality of the isolation layer 110 may be formed between the concave portion 104 and the isolation layer 110. The liner layer may include, e.g., the same material as the isolation layer 110. The isolation layer 110 may include an insulating material, and as described above, may have an etching selectivity different from that of the first sacrificial layer 102. For example, if the first sacrificial layer 102 includes silicon oxide, the isolation layer 110 may include silicon nitride. Also, if the first sacrificial layer 102 includes silicon nitride, the isolation layer 110 may include silicon oxide.

Figure 6A:
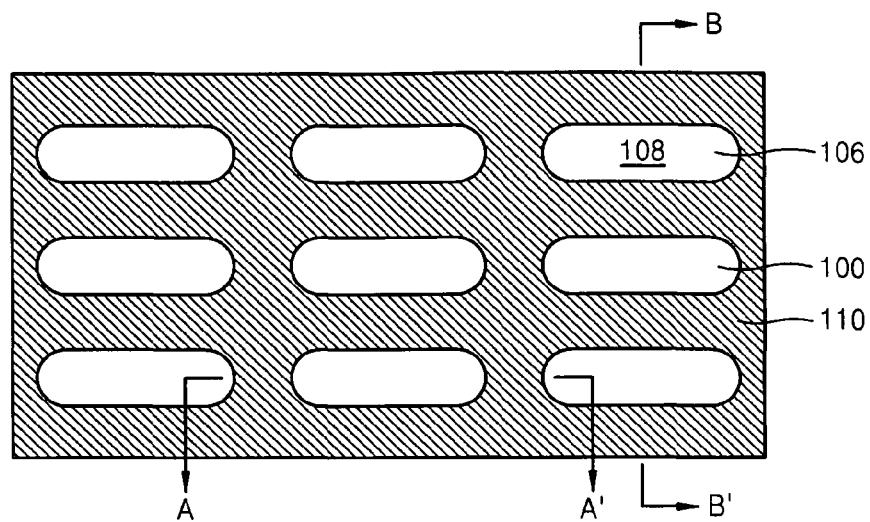
Figure 6B:
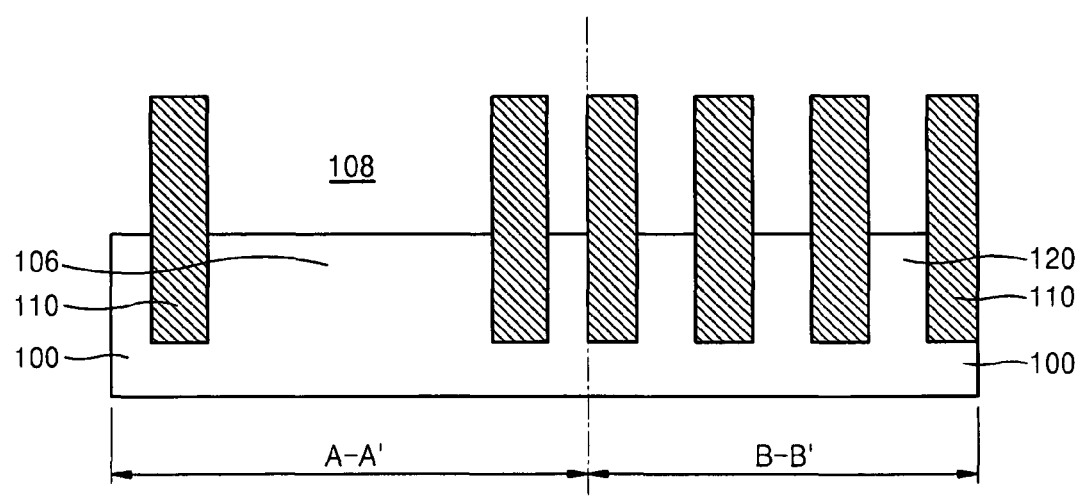

Referring to FIGS. 6A and 6B, the first sacrificial layer pattern 102a may be removed to form an opening 108 that exposes the semiconductor layer 100. The opening 108 may be surrounded by the isolation layer 110. As described above, if the first sacrificial layer patterns 102a have an etching selectivity different from that of the isolation layer 110, the isolation layer 110 may not be removed although the first sacrificial layer patterns 102a are removed by etching. Therefore, the first sacrificial layer patterns 102a may be easily removed without performing an additional photolithography process. Since the first sacrificial layer patterns 102a may be removed, the convex portion 106 of the semiconductor layer 100 may be exposed, and the isolation layer 110 may protrude from the semiconductor layer 100. Thus, discrete "islands" 106 of the semiconductor layer 100 may be completely surrounded by a "sea" of the isolation layer 110. When necessary, desired types of impurities may be injected into the convex portion 106. The convex portion 106 may function as an active region. Hereinafter, the convex portion 106 may be referred to as the active region 120.

Figure 7A:
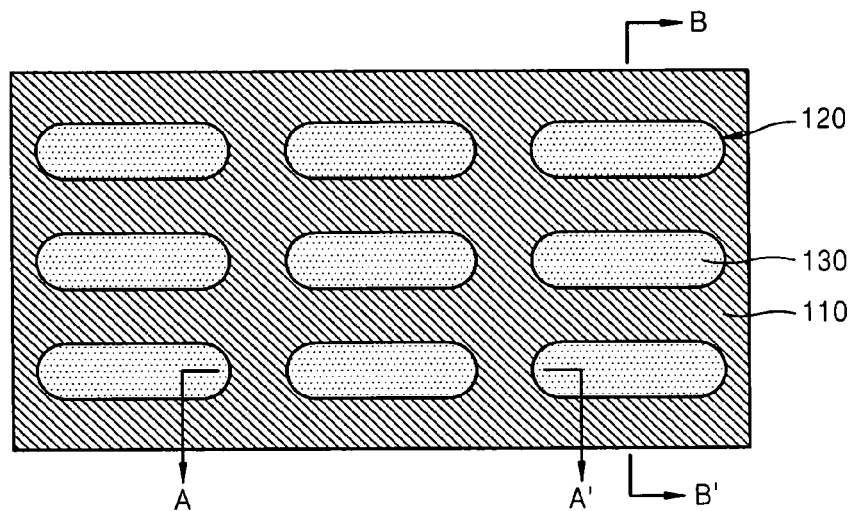
Figure 7B:
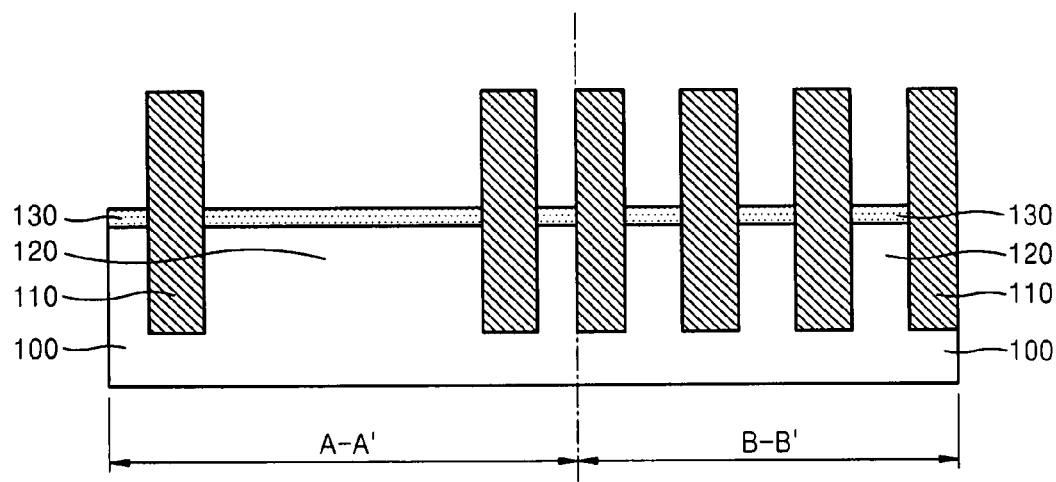

Referring to FIGS. 7A and 7B, a first interlayer insulating layer 130 may be formed on an uppermost surface of the active region 120. The first interlayer insulating layer 130 may include, e.g., oxide, nitride, or oxynitride. For example, the first interlayer insulating layer 130 may include silicon oxide, silicon nitride, or silicon oxynitride. Also, the first interlayer insulating layer 130 may have an etching selectivity different from that of the isolation layer 110.

Figure 8A:
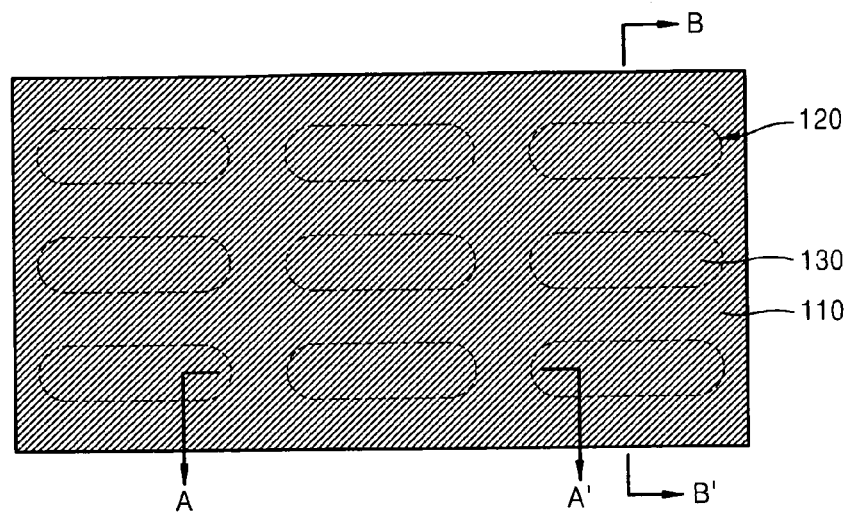
Figure 8B:
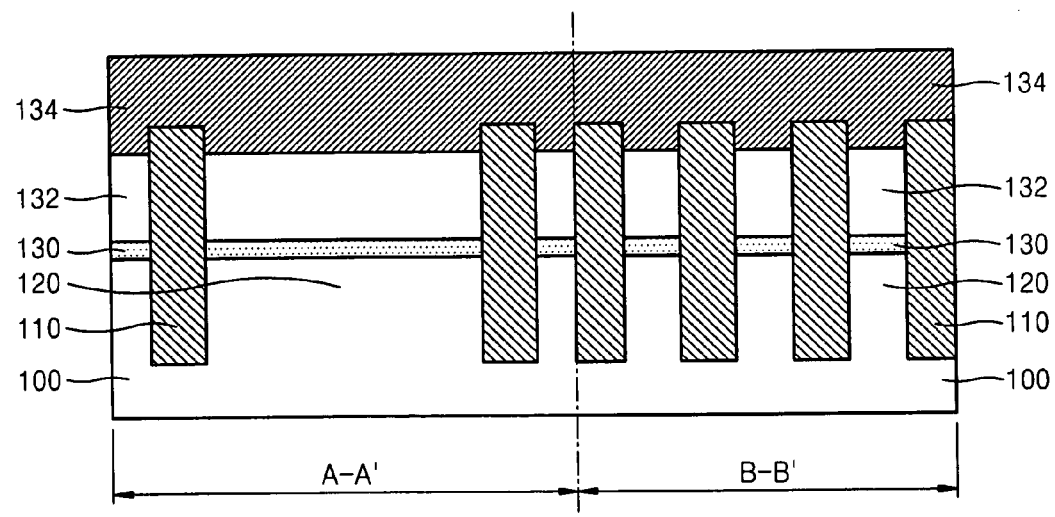

Referring to FIGS. 8A and 8B, a filling layer 132 and a second sacrificial layer 134 may be sequentially formed on and above, respectively, the first interlayer insulating layer 130. The filling layer 132 may fill a region between the isolation layer 110. The filling layer 132 may also include an insulating material or a conductive material. In an implementation, refilling layer 132 may be formed of polysilicon. An uppermost surface of the filling layer 132 may be at a lower level than an uppermost surface of the isolation layer 110, and thus, the isolation layer 110 may protrude from the filling layer 132. Such protruded isolation layer 110 may function as planarization stoppers in a subsequent process. The second sacrificial layer 134 may be formed on the filling layer 132 and the isolation layer 110. In other words, the second sacrificial layer 134 may fill a region between the isolation layer 110 and may cover the isolation layer 110. The second sacrificial layer 134 may include, e.g., oxide, nitride, or oxynitride. For example, the second sacrificial layer 134 may include silicon oxide, silicon nitride, or silicon oxynitride. Also, the second sacrificial layer 134 may have an etching selectivity different from the first interlayer insulating layer 130 and/or the isolation layer 110.

Figure 9A:
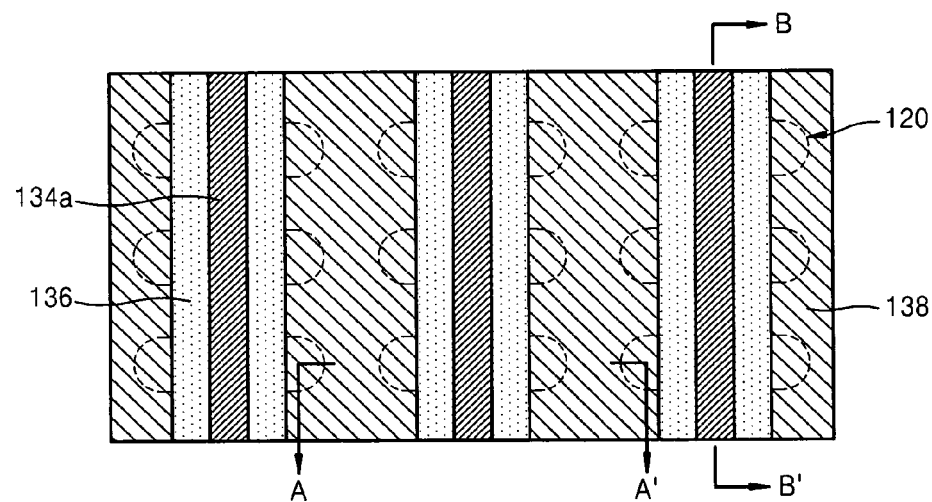
Figure 9B:
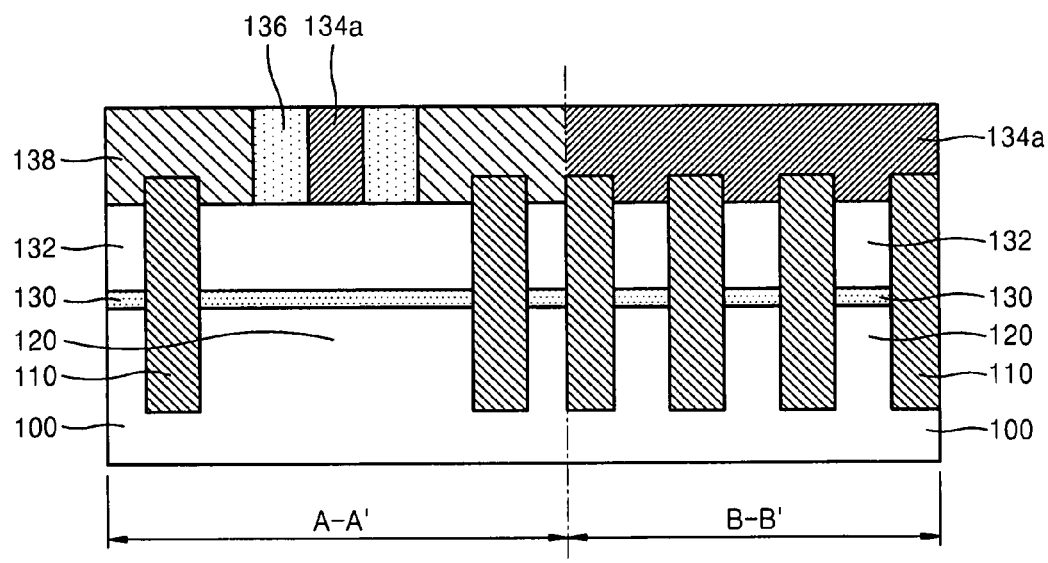

Referring to FIGS. 9A and 9B, the second sacrificial layer 134 may be patterned to form a second sacrificial layer pattern 134a that exposes the filling layer 132. The second sacrificial layer pattern 134a may extend across the active regions 120. After that, a spacer 136 may be formed at both sides of the second sacrificial layer pattern 134a. The spacer 136 may include oxide, nitride, or oxynitride. For example, the spacer 136 may include silicon oxide, silicon nitride, or silicon oxynitride. Also, the spacer 136 may have an etching selectivity different from that of the second sacrificial layer pattern 134a.

After that, a second interlayer insulating layer 138 may be formed at both sides of the spacer 136. The second interlayer insulating layer 138 may include, e.g., oxide, nitride, or oxynitride. For example, the second interlayer insulating layer 138 may include silicon oxide, silicon nitride, or silicon oxynitride. The second interlayer insulating layer 138 may have an etching selectivity different from that of the spacer 136. The second interlayer insulating layer 138 may include the same material as the second sacrificial layer 134. After forming the second sacrificial layer pattern 134a, the spacer 136, and the second interlayer insulating layer 138, their upper surfaces may be planarized.

Figure 10A:
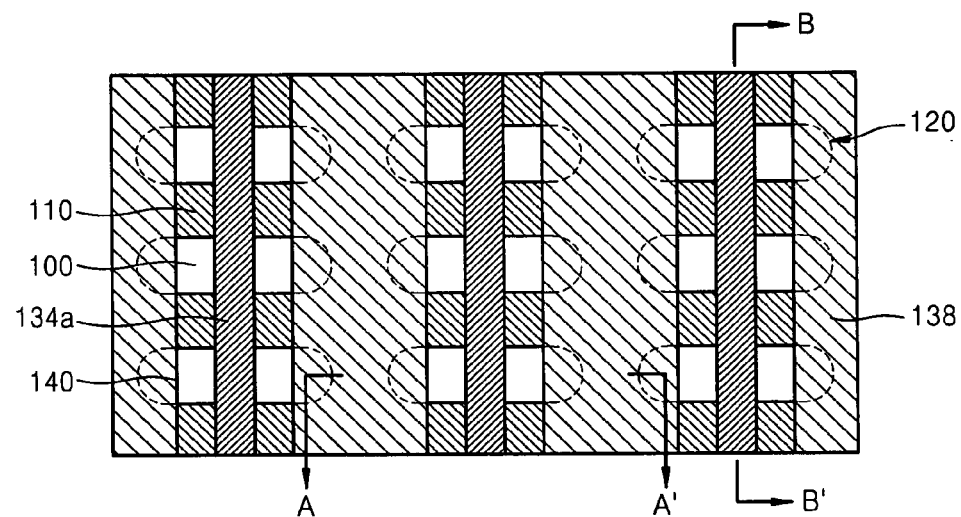
Figure 10B:
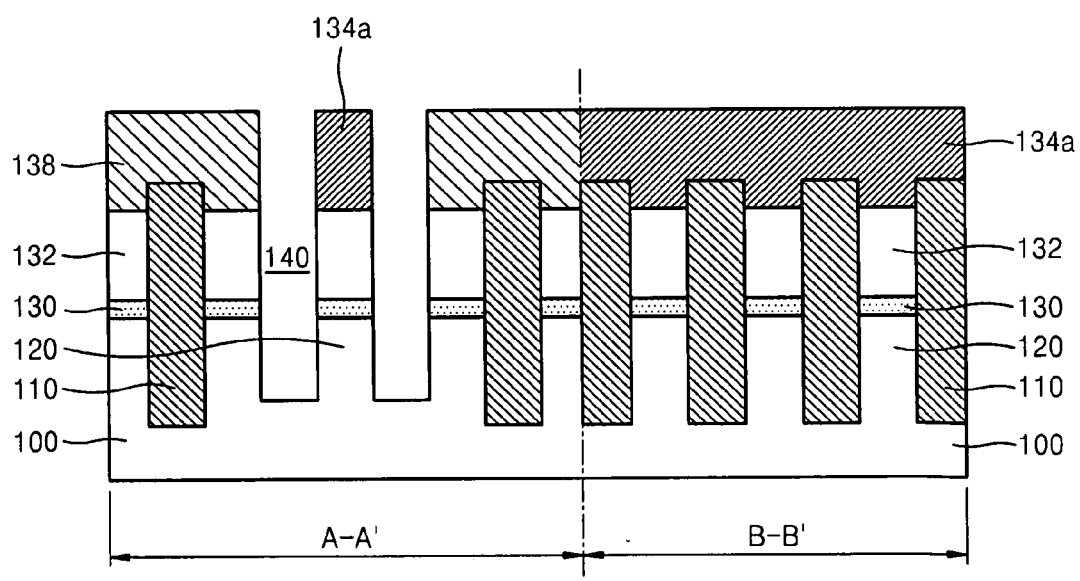

Referring to FIGS. 10A and 10B, the spacer 136, the filling layer 132 disposed below the spacer 136, and the first interlayer insulating layer 130 may be removed. As described above, since each of the second sacrificial layer patterns 134a and the second interlayer insulating layer 138 may have an etching selectivity different from that of the spacer 136, the spacer 136 may be removed by using the second sacrificial layer patterns 134a and the second interlayer insulating layer 138 as an etching mask. Also, as described above, since each of the second sacrificial layer patterns 134a and the second interlayer insulating layer 138 may have an etching selectivity different from those of the filling layer 132 and the first interlayer insulating layer 130, the filling layer 132 and the first interlayer insulating layer 130 may be removed by using the second sacrificial layer pattern 134a and the second interlayer insulating layer 138 as the etching mask.

Thereafter, a portion of the semiconductor layer 100 disposed below the spacer 136 may be removed. As described above, since each of the second sacrificial layer patterns 134a and the second interlayer insulating layer 138 may have an etching selectivity different from that of the semiconductor layer 100, the portion of the semiconductor layer 100 may be removed by using the second sacrificial layer patterns 134a and the second interlayer insulating layer 138 as the etching mask. As such, a trench 140 may be formed to expose the semiconductor layer 100.

As illustrated in FIG. 10A, the trench 140 may have the same shape as the spacer 136, and may have a line shape extending across the active regions 120, with having disposed therebetween the second sacrificial layer patterns 134a. A depth from an uppermost surface of the semiconductor layer 100 to a bottom surface of the trench 140 may be smaller than that of the isolation layer 110. Thus, the isolation layer 110 may extend higher than the trench 140 and adjacent trenches 140 may be separated by the isolation layer 110. The trench 140 may expose the semiconductor layer 100 at a lower portion thereof corresponding to the active region 120. Also, the trench 140 may expose the isolation layer 110 at a lower portion thereof corresponding to the isolation layer 110, e.g., a portion in between the active region 120. The trench 140 may expose the semiconductor layer 100, the first interlayer insulating layer 130, and the filling layer 132 at a side portion thereof corresponding to the active region 120. The trench 140 may expose the isolation layer 110 at a side portion thereof corresponding to the isolation layer 110.

As described above, since each of the second sacrificial layer patterns 134a and the second interlayer insulating layer 138 may have an etching selectivity different from those of the spacer 136, the filling layer 132, the first interlayer insulating layer 130, and the semiconductor layer 100, the second sacrificial layer patterns 134a and the second interlayer insulating layer 138 may be used as etching masks. Moreover, the second sacrificial layer patterns 134a and the second interlayer insulating layer 138 may include silicon nitride, the spacer 136 and the first interlayer insulating layer 130 may include silicon oxide, and the filling layer 132 may include polysilicon.

Figure 11A:
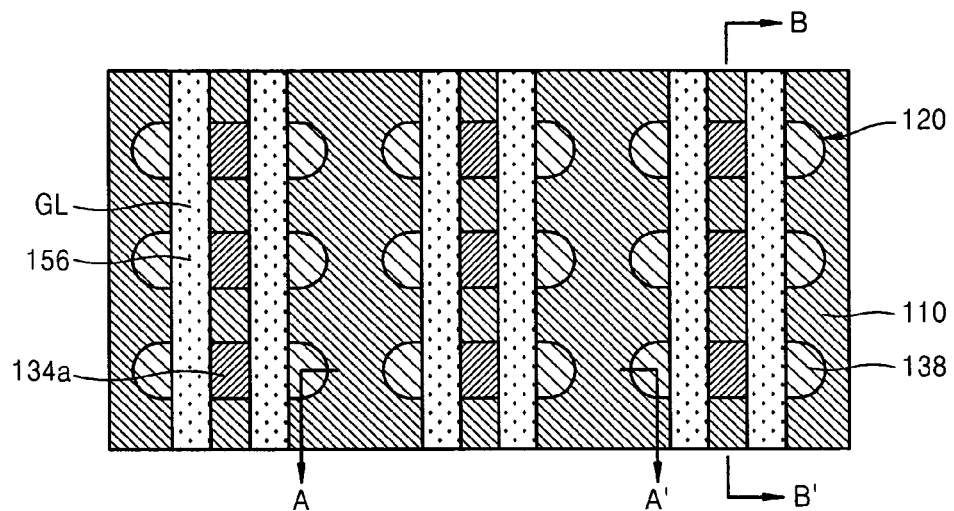
Figure 11B:
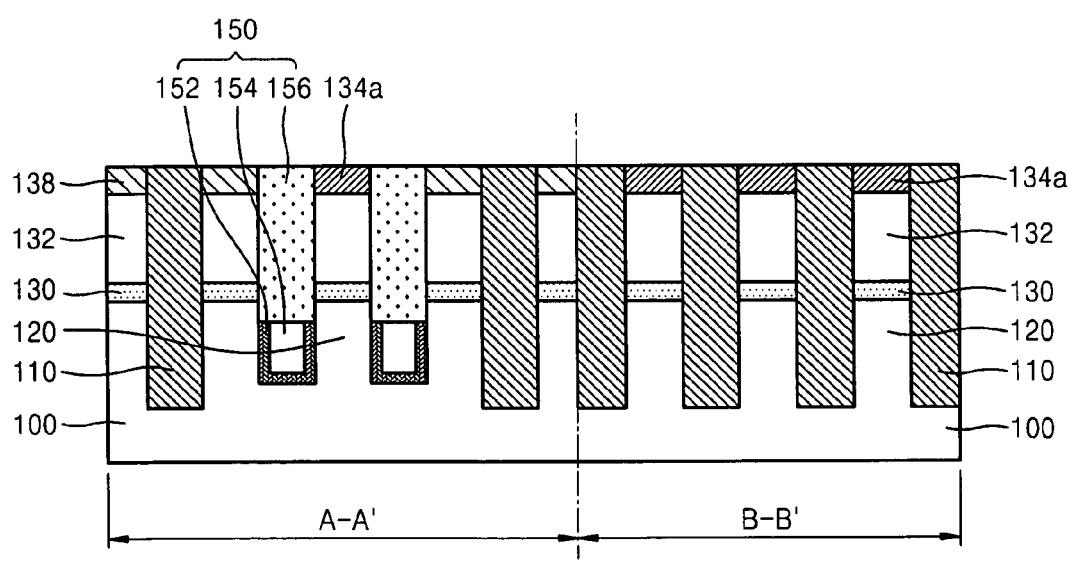

Referring to FIGS. 11A and 11B, a gate structure 150 may be formed in the trench 140. For example, a gate insulating layer 152 may be formed on a bottom surface and portions of side walls of the trench 140. Then, a gate conductive layer 154 may be formed on the gate insulating layer 152. After that, a capping layer 156 may be formed on the gate insulating layer 152 and the gate conductive layer 154 to completely fill the trench 140. The gate insulating layer 152, the gate conductive layer 154, and the capping layer 156 may constitute the gate structure 150. Next, the second interlayer insulating layer 138 may be planarized to expose the isolation layer 110. As described above, since the isolation layer 110 may function as a planarization stopper and protrudes out, compared to the filling layer 132, the isolation layer 110 may prevent the filling layer 132 from being exposed.

The gate insulating layer 152 and the gate conductive layer 154 may partially fill the trench 140, and may be buried so that an uppermost surface thereof may be at a level lower than the uppermost surface of the semiconductor layer 100. Also, as illustrated in FIG. 11A, the gate structure 150 may form a gate line GL having a line shape traversing the active regions 120. Also, the gate conductive layer 154 may function as a gate electrode and/or a wordline. The gate insulating layer 152 may include oxide, nitride, or oxynitride. For example, the gate insulating layer 152 may include silicon oxide, silicon nitride, or silicon oxynitride. Also, the gate insulating layer 152 may be a multi-layer having a double-layer structure including a silicon oxide layer and a silicon nitride layer. The gate conductive layer 154 may be formed by, e.g., CVD, PECVD, HDP-CVD, sputtering, metal organic CVD (MOCVD), ALD, or the like. The gate conductive layer 154 may include, e.g., polysilicon, TiN, Ti/TiN, WN, W/WN, TaN, Ta/TaN, TiSiN, TaSiN, WSiN, W, Al, Cu, Mo, Ti, Ta, Ru, or combinations thereof The capping layer 156 may include, e.g., oxide, nitride, or oxynitride. For example, the capping layer 156 may include silicon oxide, silicon nitride, or silicon oxynitride.

Figure 12A:
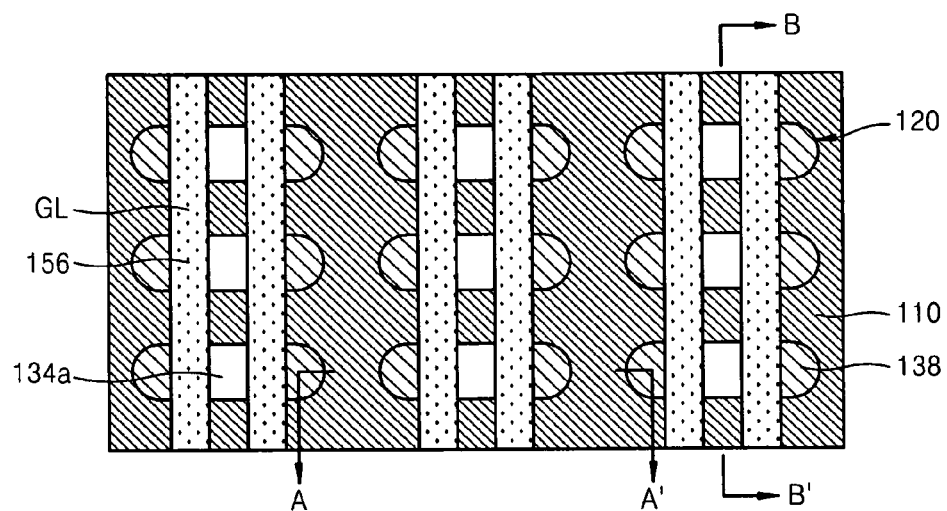
Figure 12B:
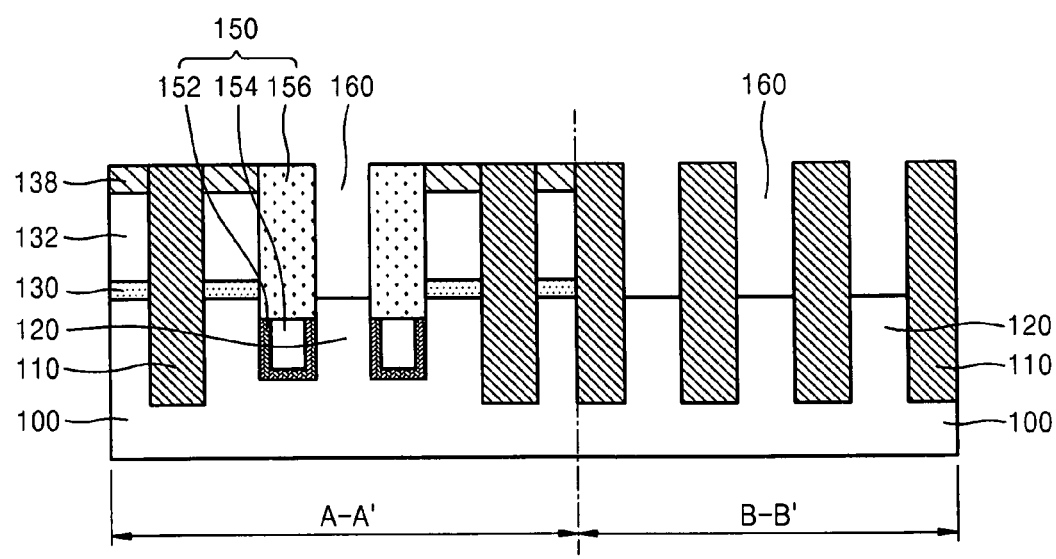

Referring to FIGS. 12A and 12B, the second sacrificial layer pattern 134a, the filling layer 132, and the first interlayer insulating layer 130 disposed between the gate structures 150 may be removed to form a contact hole 160. The contact hole 160 may expose the semiconductor layer 100, i.e., the active region 120 between the gate lines GL. Since the isolation layer 110 is exposed, the contact hole 160 may be easily formed at a desired position. Also, if each, or at least one of, the isolation layer 110, the capping layer 156 and the second interlayer insulating layer 138 has an etching selectivity different from those of the second sacrificial layer pattern 134a, then the filling layer 132 and/or the first interlayer insulating layer 130, the isolation layer 110, the capping layer 156 and/or the second interlayer insulating layer 138 may be used as an etching mask. This is known as a self aligned contact (SAC) forming method.

Figure 13A:
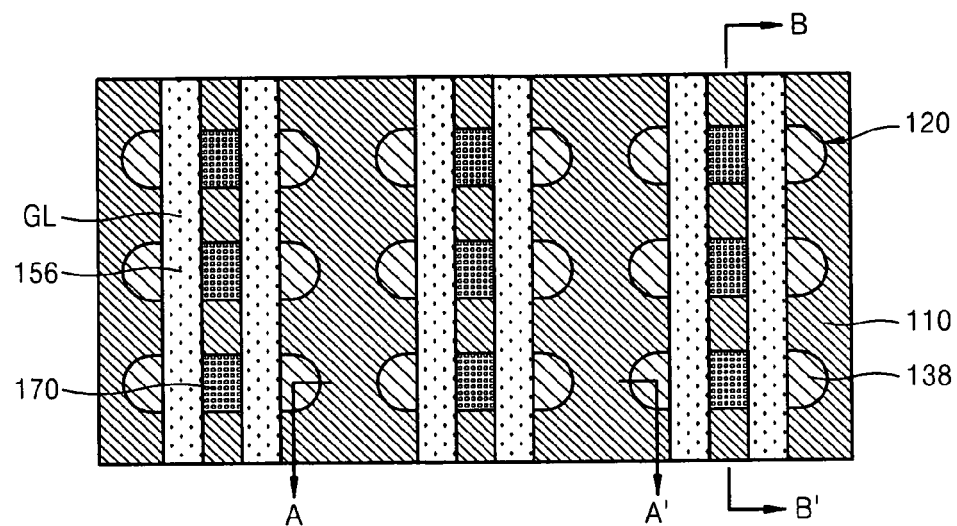
Figure 13B:
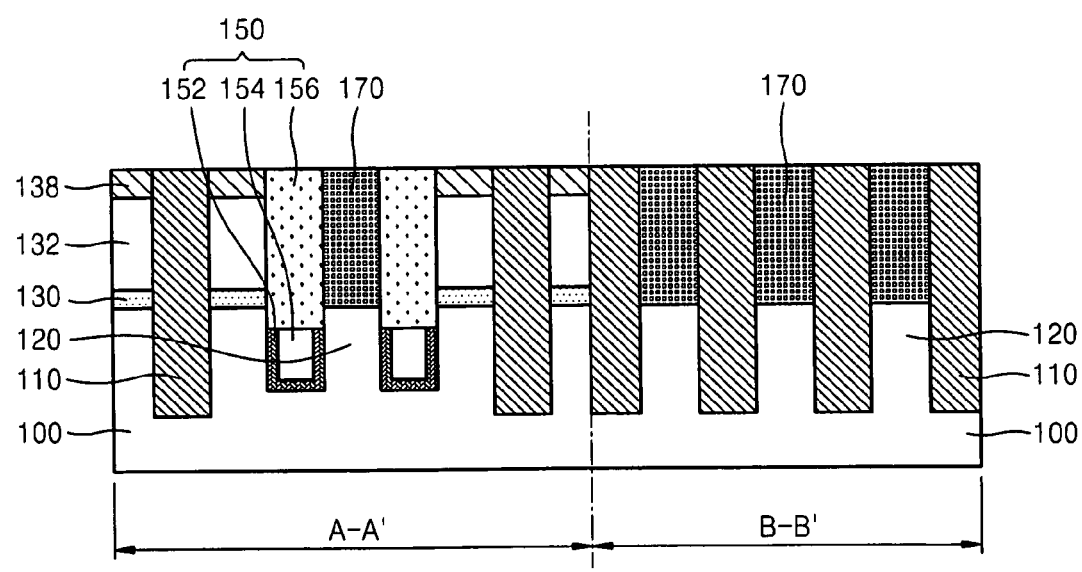

Referring to FIGS. 13A and 13B, the contact hole 160 may be filled with a conductive material, thereby forming a contact plug 170. The contact plug 170 may be electrically connected to the active region 120 of the semiconductor layer 100. For example, the contact plug 170 may be electrically connected to a drain region of the gate structure 150. Also, the contact plug 170 may include a bit line contact plug electrically connected to a bit line BL (refer to FIG. 14A) that may be formed in a subsequent process. The contact plug 170 may include, e.g., polysilicon, TiN, Ti/TiN, WN, W/WN, TaN, Ta/TaN, TiSiN, TaSiN, WSiN, W, Al, Cu, Mo, Ti, Ta, Ru, or combinations thereof Also, the contact plug 170 may be a multi-layer formed by stacking a plurality of layers.

Figure 14A:
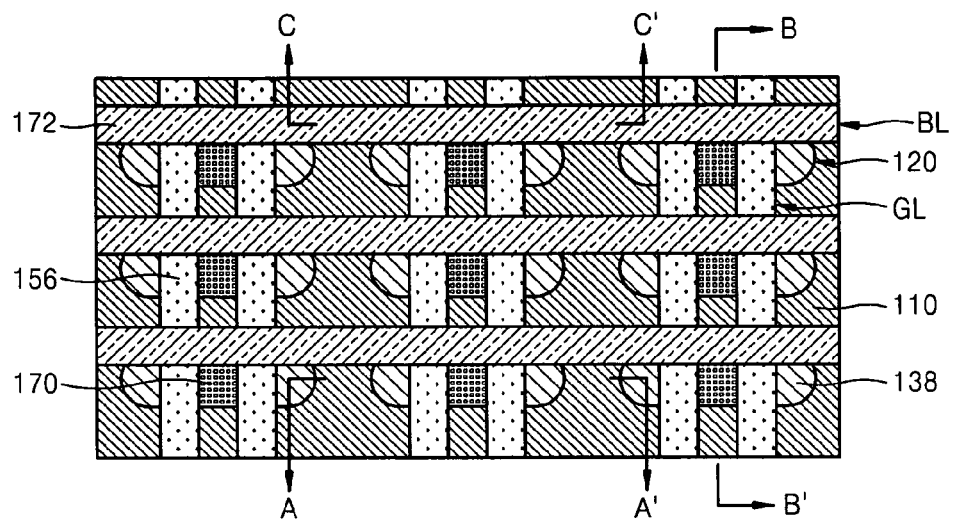
Figure 14B:
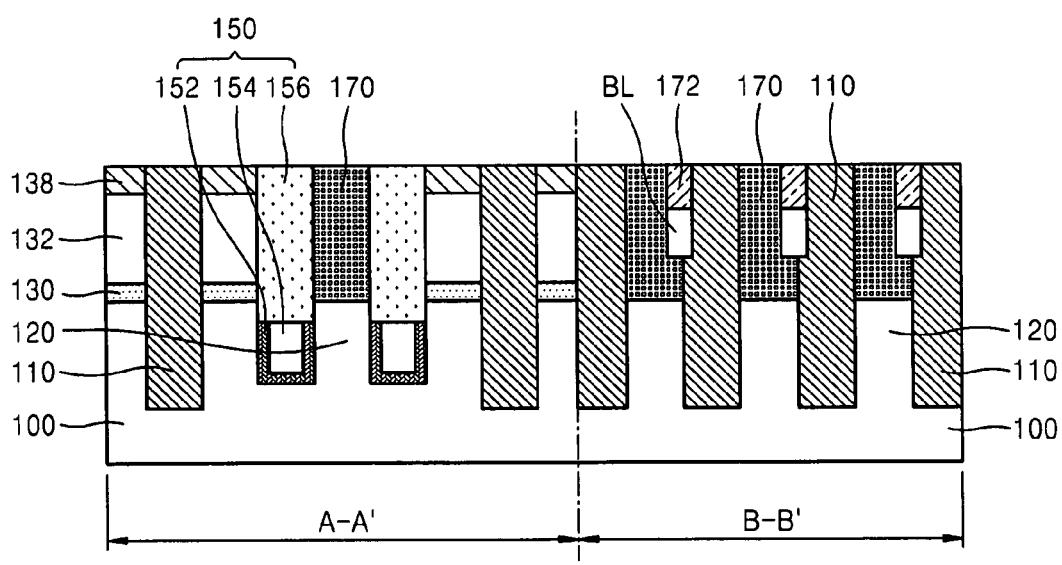

Referring to FIGS. 14A and 14B, the bit line BL may be formed to be electrically connected to the contact plug 170 and to cross the gate line GL. A bit line capping layer 172 including an insulating material may be formed on the bit line BL. Since the isolation layer 110 is exposed, the bit line BL may be easily formed at a desired position. The bit line BL may include, e.g., polysilicon, TiN, Ti/TiN, WN, W/WN, TaN, Ta/TaN, TiSiN, TaSiN, WSiN, W, Al, Cu, Mo, Ti, Ta, Ru, or combinations thereof. In FIGS. 14A and 14B, the bit line BL may be of a buried type that does not protrude from the uppermost surface of the isolation layer 110.

A buried type bit line BL may be formed using, e.g., a damascene method. In an exemplary damascene method, an upper portion of a structure shown in FIGS. 13A and 13B, e.g., the contact plug 170 and/or the isolation layer 110, may be partially removed to form a trench (not shown). This trench may be filled with a conductive material. An upper portion of the structure having a partially removed section may include the isolation layer 110, the second interlayer insulating layer 138, the capping layer 156, the contact plug 170, and the filling layer 132. Thus, the bit line BL may be electrically connected to the active region 120 of the semiconductor layer 100, while it may also be electrically insulated from other portions of the semiconductor layer 100 by the isolation layer 110 and/or the first interlayer insulating layer 130. Embodiments are not limited to the buried type bit line BL.

Although not illustrated in the drawings, a storage capacitor (not shown) may be formed to be electrically connected to portions, e.g., source regions, of the active regions 120 of the semiconductor layer 100 so that a dynamic random access memory (DRAM) device may be formed. Also, although the isolation layer 110 is described with respect to a cell region, the isolation layer 110 may also be formed in a peripheral region.

Figure 15:
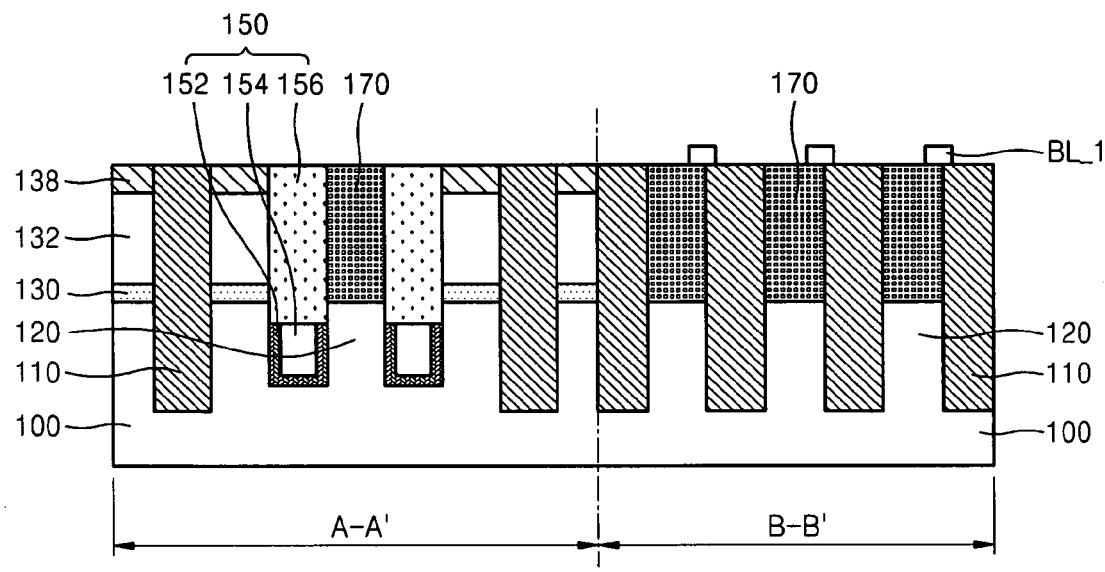
FIG. 15 illustrates a cross-sectional view of a semiconductor device including a protrusion type isolation layer having an external surface on which a bit line is formed according to another embodiment.

FIG. 15 illustrates a cross-sectional view of a semiconductor device including a protrusion type isolation layer having an external surface on which a bit line BL_1 is formed according to an exemplary embodiment. Referring to FIG. 15, the bit line BL_1 may be of an external type, which may be disposed at the upper portion of the structure as illustrated in FIGS. 13A and 13B, and may be electrically connected to the contact plug 170. When the bit line BL_1 is formed, the structure illustrated in FIGS. 13A and 13B, e.g., the contact plug 170 and/or an isolation layer 110, may not be removed. The bit line BL_1 may be formed using a general etching method. For example, a bit line conductive layer (not shown) may be formed on the structure illustrated in FIGS. 13A and 13B, e.g., on the contact plug 170 and/or the isolation layer 110, and then the bit line conductive layer may be etched.

The bit line BL_1 may be formed using the damascene method. For example, an insulating layer (not shown) may be formed on the structure illustrated in FIGS. 13A and 13B and may be patterned to form a trench. The trench may be filled with a bit line conductive material and may be planarized. The aforementioned external type bit line BL_1 may be formed together with the bit line that is formed in a peripheral region.

FIG. 16 illustrates a top view of a semiconductor device having an isolation layer 210 according to an exemplary embodiment. Detailed descriptions of the features of FIG. 16 that are the same as the aforementioned contents may not be repeated below.

Referring to FIG. 16, a semiconductor device may include a plurality of active regions 220 that are arrayed in parallel along a first direction. The plurality of active regions 220 may be surrounded by the isolation layer 210 that is a protrusion type isolation layer. As described above, the isolation layer 210 may be protruded out, compared to the plurality of active regions 220 on the semiconductor layer 200. Also, the semiconductor device may include gate lines GL and bit lines BL electrically connected to the plurality of active regions 220.

A method of manufacturing the semiconductor device that has a protrusion type isolation layer 110, according to an exemplary embodiment, may first include providing a semiconductor layer 100. Thereafter, a first sacrificial layer 102 may be formed above the semiconductor layer, and the first sacrificial layer 102 may be patterned to form a first sacrificial layer pattern 102a to expose portions of the semiconductor layer. The exposed portions of the semiconductor layer 100 may be removed by using the first sacrificial layer pattern 102a as an etching mask, thereby the concave portion 104 and the convex portion 106 may be formed in the semiconductor layer 100. Then, the isolation layer 110 may be formed to fill the concave portion 104, and the isolation layer 110 may also be formed to extend to fill a space between the first sacrificial layer patterns to have a level higher than an uppermost surface of the convex portion 106. Then, the first sacrificial layer pattern 102a may be removed to form a plurality of openings 108 partially exposing the semiconductor layer 100.

The method of manufacturing the semiconductor device may also include sequentially forming the first interlayer insulating layer 130, the filling layer 132, and the second sacrificial layer 134 on and above the convex portion 106. The second sacrificial layer 134 may be patterned to expose a portion of the filling layer 132, the second sacrificial layer 134a, and the second interlayer insulating layer 138. Then, a spacer 136 may be formed on side surfaces of the second sacrificial layer pattern 134a. Next, the spacer 136 may be removed, and trenches 140 may be formed by removing at least the filling layer 132 and the first interlayer insulating layer 130 by using the second interlayer insulating layer 138 as an etching mask. Next, the gate structure 150 may be formed in at least one or each of the trenches 140.

The contact hole 160 disposed between the gate structures 150 may be formed by removing the second sacrificial layer pattern 134a, a portion of the filling layer 132, and a portion of the interlayer insulating layer 132. Then, the contact plug 170 may be formed by filling a conductive material in the contact hole 160. Thereafter, a bit line BL may be formed that is electrically connected to the contact plug 170 and crossing the gate line GL.

Exemplary embodiments have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A semiconductor device, comprising:
   a semiconductor layer including a convex portion and a concave portion surrounding the convex portion;
   a protrusion type isolation layer filling the concave portion and extending upward so that an uppermost surface of the isolation layer is at a level higher than an uppermost surface of the convex portion;
   at least one trench in the convex portion;
   at least one gate structure in the at least one trench, the at least one gate structure having a gate insulating layer and a gate conductive layer that are buried in the semiconductor layer, and an uppermost surface of the at least one gate structure being at a level lower than the uppermost surface of the isolation layer; and
   a contact plug on and electrically connected to a source/drain region of the convex portion, the contact plug being surrounded by the isolation layer.

2. The semiconductor as claimed in claim 1, wherein the uppermost surface of the at least one gate structure is at a level lower than the uppermost surface of the convex portion.

3. The semiconductor as claimed in claim 1, further comprising a capping layer on the gate conductive layer that fills the trench, the capping layer having an uppermost surface that is at about the same level as the uppermost surface of the isolation layer.

4. The semiconductor as claimed in claim 1, wherein an uppermost surface of the contact plug is at about the same level as the uppermost surface of the isolation layer.

5. The semiconductor as claimed in claim 1, wherein the isolation layer includes a plurality of openings in an array, each opening exposing an active region of the semiconductor layer.

6. The semiconductor as claimed in claim 1, wherein the isolation layer includes silicon nitride.

7. The semiconductor as claimed in claim 1, further comprising an insulating layer on a portion of the convex portion.

8. The semiconductor as claimed in claim 1, further comprising a bit line electrically connected to the contact plug, the bit line being disposed below the uppermost surface of the isolation layer.

9. The semiconductor as claimed in claim 1, further comprising a bit line electrically connected to the contact plug, the bit line being disposed above the uppermost surface of the isolation layer.

10. The semiconductor as claimed in claim 1, wherein a plurality of convex portions are arranged on the semiconductor layer in an array.

11. The semiconductor device as claimed in claim 1, wherein the at least one trench traverses the convex portion.

12. The semiconductor device as claimed in claim 1, wherein the at least one trench has a line shape.

13. The semiconductor device as claimed in claim 1, wherein:
   the convex portion extends upward in a first direction;
   the protrusion type isolation layer extends upward in the first direction away from the semiconductor layer such that the uppermost surface of the isolation layer is at the level higher than the uppermost surface of the convex portion in the first direction;
   the gate conductive layer extends upward in the first direction such that an uppermost surface of the gate conductive layer is at a level lower than the uppermost surface of the isolation layer in the first direction; and
   the uppermost surface of the gate conductive layer is at a level lower than the uppermost surface of the convex portion in the first direction.

14. The semiconductor device as claimed in claim 1, wherein the isolation layer extends upward at a level higher than an uppermost surface of the semiconductor layer and an uppermost surface of the gate conductive layer is at a level lower than the uppermost surface of the isolation layer.

15. A semiconductor device, comprising:
   a semiconductor layer including a convex portion and a concave portion surrounding the convex portion;
   a protrusion type isolation layer filling the concave portion and extending upward so that an uppermost surface of the isolation layer is at a level higher that an uppermost surface of the convex portion;
   at least one trench in the convex portion; and
   at least one gate structure in the at least one trench, the at least one gate structure having a gate insulating layer and a gate conductive layer that are buried in the semiconductor layer, and an uppermost surface of the at least one gate structure being at a level lower than the uppermost surface of the isolation layer.

16. The semiconductor as claimed in claim 15, wherein the isolation layer includes a plurality of openings in an array, each opening exposing an active region of the semiconductor layer.

17. The semiconductor as claimed in claim 15, wherein the convex portions and the concave portions are arranged on the semiconductor layer by using a first sacrificial layer pattern as an etching mask.

18. The semiconductor device as claimed in claim 15, wherein:
   the convex portion extends upward in a first direction;
   the protrusion type isolation layer extends upward in the first direction away from the semiconductor layer such that the uppermost surface of the isolation layer is at the level higher than the uppermost surface of the convex portion in the first direction;
   the gate conductive layer extends upward in the first direction such that an uppermost surface of the gate conductive layer is at a level lower than the uppermost surface of the isolation layer in the first direction; and the uppermost surface of the gate conductive layer is at a level lower than the uppermost surface of the convex portion in the first direction.

19. The semiconductor device as claimed in claim 15, wherein the isolation layer extends upward at a level higher than an uppermost surface of the semiconductor layer and an uppermost surface of the gate conductive layer is at a level lower than the uppermost surface of the isolation layer.

* * * * *